(12) United States Patent
Kubo

(10) Patent No.: US 7,674,984 B2
(45) Date of Patent: Mar. 9, 2010

(54) WIRING BOARD

(75) Inventor: Tomoyuki Kubo, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 13 days.

(21) Appl. No.: 11/426,399

(22) Filed: Jun. 26, 2006

(65) Prior Publication Data

US 2007/0003744 A1  Jan. 4, 2007

(30) Foreign Application Priority Data

Jun. 30, 2005  (JP)  ............................. 2005-192369

(51) Int. Cl.
*H05K 1/00*  (2006.01)

(52) U.S. Cl. .................. 174/254; 174/255; 174/260; 174/261; 361/749; 361/751; 361/761

(58) Field of Classification Search ......... 174/250–255, 174/260, 261; 428/209; 361/749, 751, 761
See application file for complete search history.

(56) References Cited

U.S. PATENT DOCUMENTS

| | | | | |
|---|---|---|---|---|
| 4,295,695 A | * | 10/1981 | Dodds | ........................ 439/74 |
| 4,635,359 A | * | 1/1987 | Nozick | ........................ 29/878 |
| 5,274,195 A | * | 12/1993 | Murphy et al. | ......... 174/117 FF |
| 5,669,775 A | * | 9/1997 | Campbell et al. | ............. 439/77 |
| 5,798,780 A | | 8/1998 | Koizumi et al. | |
| 6,027,208 A | | 2/2000 | Amano | |
| 6,190,006 B1 | | 2/2001 | Kurashima et al. | |
| 6,313,526 B1 | * | 11/2001 | Nakamura | ................... 257/706 |
| 6,319,019 B1 | * | 11/2001 | Kwon et al. | ................... 439/67 |
| 6,509,630 B1 | * | 1/2003 | Yanagisawa | ................ 257/668 |

FOREIGN PATENT DOCUMENTS

| | | | |
|---|---|---|---|
| JP | 2695441 B2 | | 1/1990 |
| JP | 09109388 A | | 4/1997 |
| JP | 3521768 B2 | | 2/1999 |
| JP | 2000-340617 | * | 12/2000 |
| JP | 2003060323 A | | 2/2003 |
| JP | 2003273476 A | | 9/2003 |
| JP | 2003273486 A | | 9/2003 |

* cited by examiner

*Primary Examiner*—Cathy Lam
(74) *Attorney, Agent, or Firm*—Baker Botts L.L.P.

(57) ABSTRACT

In order to prevent stress caused by bending a flexible wiring board from being applied to the connection section between the flexible wiring board and a driving IC, solder is deposited as a reinforcement member, on both sides of the driving IC connected onto the flexible wiring board.

15 Claims, 7 Drawing Sheets

F I G. 6
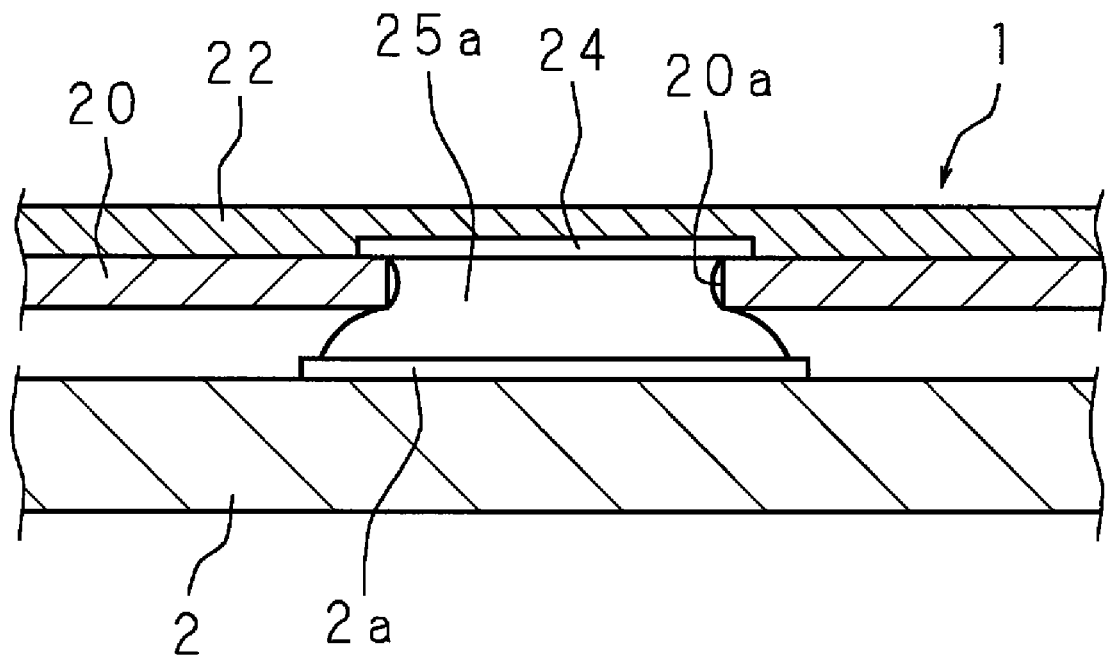

WIRING BOARD

CROSS-REFERENCE TO RELATED APPLICATION

This non-provisional application claims priority under 35 U.S.C. §119(a) on Patent Application No. 2005-192369 filed in Japan on Jun. 30, 2005, the entire contents of which are hereby incorporated by reference.

BACKGROUND

The present invention relates to a wiring board having a circuit component connected to an insulating film on which a wire pattern is formed and capable of being mounted in a bent condition in an electric device.

In an inkjet printer, color printing is performed using a plurality of ink cartridges, such as cyan, magenta, yellow and black ink cartridges. Inks supplied from a plurality of ink cartridges are ejected from a plurality of ejection outlets formed in an inkjet head by pressure generated by a piezoelectric element. The piezoelectric element generates pressure according to a drive voltage supplied from a driving IC, and the drive voltage from the driving IC is supplied to the piezoelectric element through a flexible wiring board.

The flexible wiring board is a flexible board with a plurality of wires provided on one surface or both surfaces of an insulating film. Using the flexible wiring board for the transmission of a drive voltage, a control signal, etc. is advantageous because it is possible to increase the degree of freedom in mounting an inkjet head in an inkjet printer and it is possible to decrease the size of the inkjet printer. In recent years, a COF (Chip On Film) having a driving IC connected directly to a flexible wiring board has been put into practical use. Since the COF can shorten the distance from the driving IC to the piezoelectric element, it is possible to reduce the attenuation and delay of the drive voltage, and it is possible to efficiently drive the piezoelectric element.

Moreover, since the COF can be mounted in a bent condition in the inkjet printer, it has advantages that it is possible to decrease the size of the inkjet printer and increase the degree of freedom in designing the inkjet printer. However, since the driving IC is connected to the wire on the insulating film of the COF by solder, if the insulating film is bent, bending stress is applied to the connection section connected by the solder, and there is a possibility that the connection between the insulating film and the driving IC maybe destroyed.

In the case where a liquid crystal driving IC is mounted on a flexible board on which a plurality of wires are provided, Japanese Patent Application Laid-Open No. 2003-273486 proposed a mount structure that improved the bending resistance of the flexible board by making wires placed on both sides of the liquid crystal driving IC among the plurality of wires wider than the other wires. In Japanese Patent Application Laid-Open No. 2003-273476, wide dummy wires are further provided outside the both wide wires to further improve the bending resistance.

SUMMARY

However, the mount structures disclosed in the Japanese Patent Applications Laid-Open No. 2003-273486 and No. 2003-273476 aim at increasing the strength of the wires themselves by making the wires located on both sides among the plurality of wires wider, but do not aim at improving the reliability of the connection between the liquid crystal driving IC and the flexible board. For instance, the connection section is not sufficiently reinforced by only the wide wires, and, if the flexible wiring board is bent in the vicinity of the connection section between the liquid crystal driving IC and the flexible board for mounting the flexible wiring board, the connection section may be destroyed by stress due to bending.

In order to solve the above problems, and it is an object to provide a wiring board, wherein a circuit component is connected to an insulating film, and, even if a bent portion of the insulating film is near the connection section between the insulating film and the circuit component, the connection section is not destroyed by the bending stress applied to the connection section.

It is another object to provide a wiring board, wherein a circuit component is connected to an insulating film, and, when the insulating film is bent in a manufacturing step of mounting the wiring board, and after the mount of the wiring board, the bending stress is not applied to the connection section between the insulating film and the circuit component, thereby preventing destruction of the connection section.

A wiring board according to a first aspect is a wiring board including: an insulating film having a plurality of wires; and a circuit component connected to the wires on one surface of the insulating film, and characterized by comprising a reinforcement member, attached to the insulating film, for preventing the insulating film from being bent.

In the first aspect, the reinforcement member attached to the insulating film prevents stress caused by bending the insulating film from affecting the connection section between the circuit component and the insulating film.

A wiring board according to a second aspect is a wiring board including: an insulating film having a plurality of wires; and a circuit component connected to the wires on one surface of the insulating film, wherein the wiring board is mounted in a state in which the insulating film is bent at a predetermined position, and characterized by comprising a reinforcement member, attached to the insulating film in a direction crossing a bending direction of the insulating film, for preventing the insulating film from being bent other than the predetermined position.

In the second aspect, the reinforcement member attached to the insulating film prevents stress caused by bending the insulating film in mounting the wiring board from affecting the connection section between the circuit component and the insulating film.

According to the first aspect, in the case where the circuit component is connected to the insulating film, the bending resistance of the wiring board is improved by depositing the reinforcement member for preventing bending on the insulating film. Further, in the case where the reinforcement member is provided in the vicinity of the circuit component to prevent bending of the insulating film near the circuit component, stress due to bending will not be applied to the connection section between the insulating film and the circuit board. Consequently, destruction of the connection section will not occur, and it is possible to decrease the defect ratio in the manufacturing step and improve the yield.

According to the second aspect, in the case where the circuit component is connected to the insulating film, the reinforcement member for preventing bending is deposited on the insulating film in a direction crossing the direction of bending the insulating film for mount, and therefore bending stress is not applied to the connection section between the insulating film and the circuit component when the insulating film is bent in the manufacturing step of mounting the wiring board. Consequently, destruction of the connection section will not occur, and it is possible to decrease the defect ratio in the manufacturing step. Moreover, after mounting the wiring board by bending it, stress due to bending will not be applied to the connection section, and therefore it is possible to eliminate the possibility of occurrence of defects after the shipment of products.

The above and further objects and features will more fully be apparent from the following detailed description with accompanying drawings.

BRIEF DESCRIPTION OF THE SEVERAL VIEWS OF THE DRAWINGS

FIG. 6 is an enlarged cross sectional view showing the structure of a connection section between the flexible wiring board and a piezoelectric element.

DETAILED DESCRIPTION OF THE EXEMPLARY EMBODIMENTS

The following description will explain the present embodiment based on the drawings.

Embodiment 1

Figure 1:
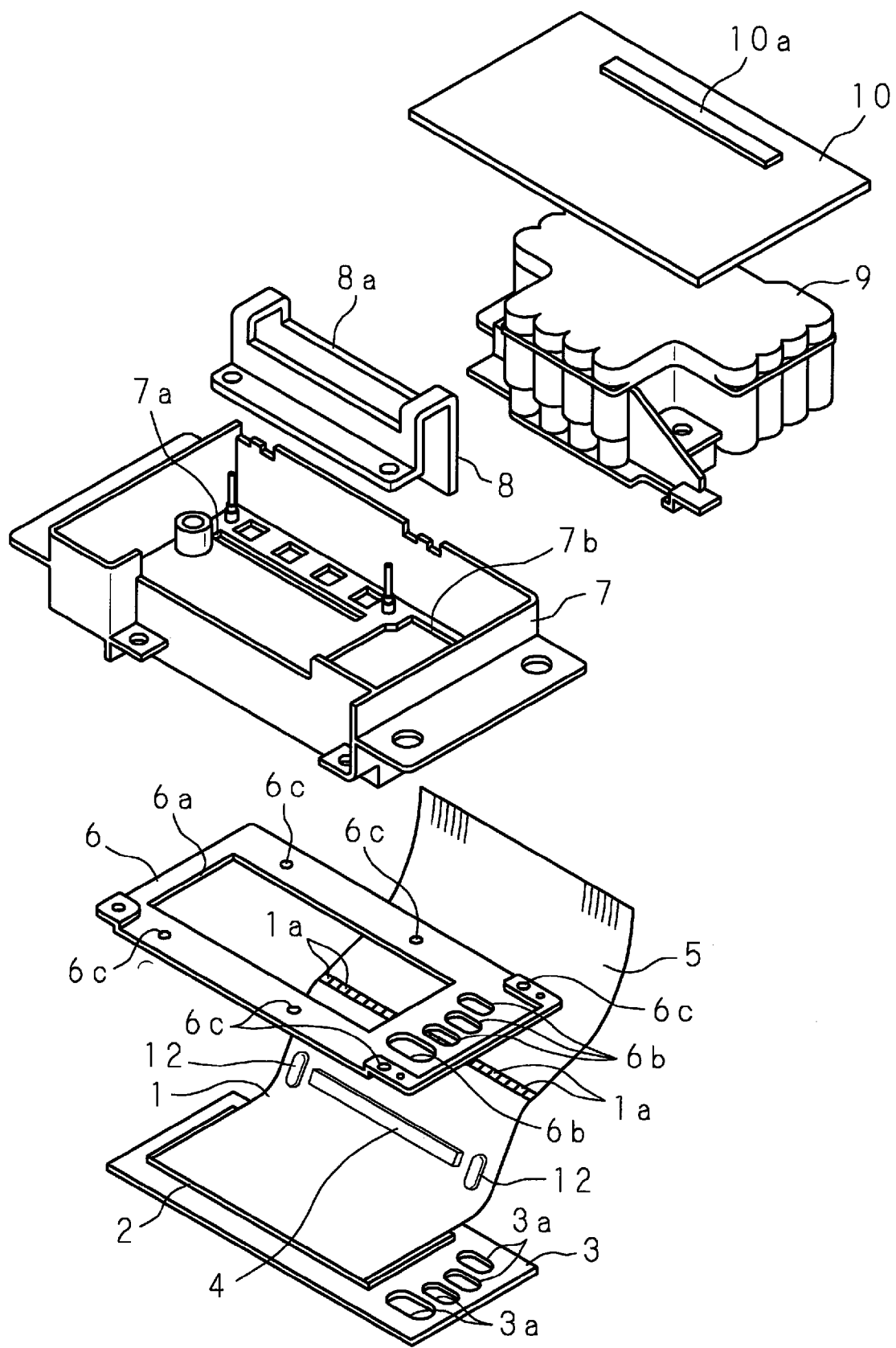
FIG. 1 is an exploded perspective view showing the structure of an inkjet head.
Figure 2:
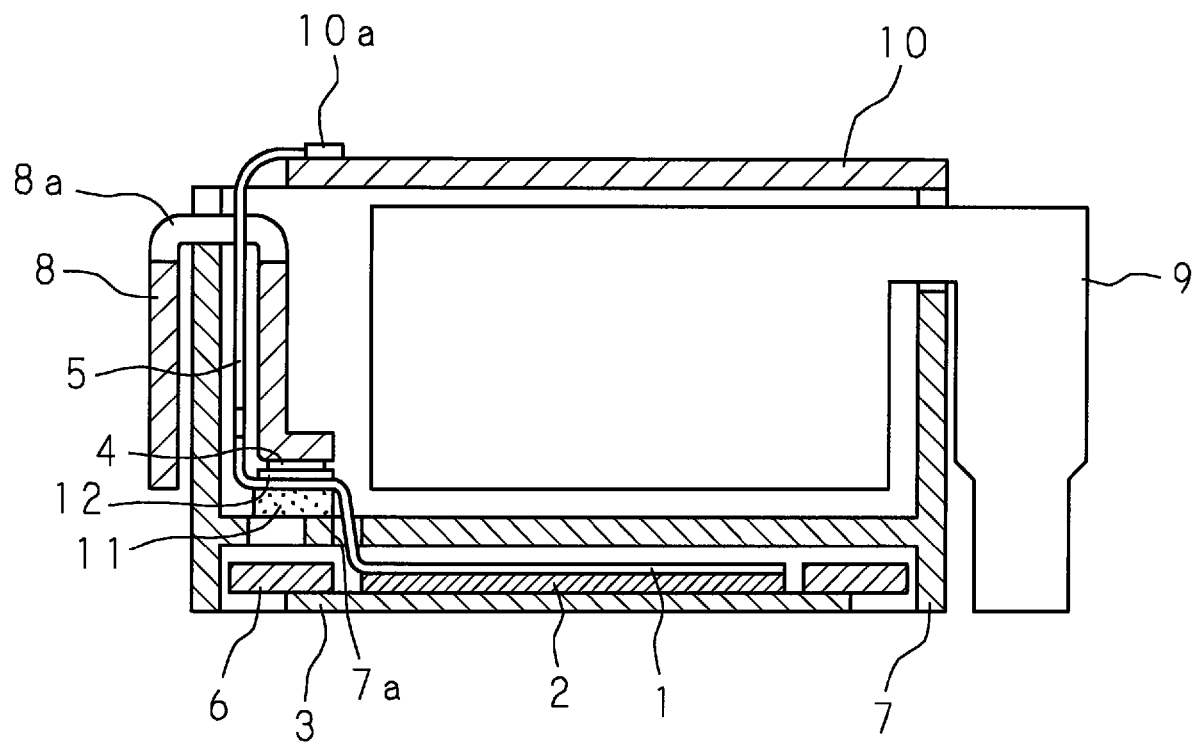
FIG. 2 is a sectional side view showing the structure of the inkjet head.

FIG. 1 is an exploded perspective view showing the structure of an inkjet head; and FIG. 2 is a sectional side view showing the structure of the inkjet head.

As shown in FIGS. 1 and 2, the inkjet head has a channel unit 3 that is placed to face a recording medium and ejects an ink. The channel unit 3 is produced by stacking a plurality of metal plates having mutually different shaped through-holes on a resin nozzle plate having a substantially rectangular outside shape and a plurality of ink ejection outlets. The through-holes of the plurality of metal plates are continued one above the other, so that spaces serving as ink channels and ink pressure chambers, etc. are formed in the channel unit 3. An ink channel is provided for each of cyan, magenta, yellow, and black color inks, and an ink pressure chamber is provided on the upper side of the channel unit 3 for each ejection outlet. On one end of a longitudinal direction of the upper surface of the channel unit 3, four ink supply openings, 3a, 3a, . . . for supplying an ink to each ink channel are arranged along a short side of the channel unit 3. When the inks are supplied from the ink supply openings 3a, 3a . . . , the inks are distributed to the respective ink pressure chambers through the ink channels and ejected from the ink ejection outlets in the lower surface of the channel unit 3.

A piezoelectric element 2 for applying pressure to eject the ink in each ink pressure chamber is bonded to the upper surface of the channel unit 3 by an adhesive. The piezoelectric element 2 is in the form of a substantially rectangular plate smaller than the channel unit 3, and bonded along the longitudinal direction of the channel unit 3 near a short side where the ink supply openings 3a, 3a . . . are not formed. For example, the piezoelectric element 2 is produced by stacking a plurality of $PbTiO_3$-$PbZrO_3$ based ceramic plates. On the upper surface of the piezoelectric element 2, a plurality of individual terminals corresponding to the respective ink pressure chambers are arranged in a plurality of lines, and a plurality of common terminals to be ground potential are provided to surround the periphery of the plurality of individual terminals. A drive voltage for applying pressure to eject the ink by deforming the piezoelectric element 2 is applied through the individual terminal.

A flexible wiring board 1 in the form of a film having a plurality of wires is connected to the upper surface of the piezoelectric element 2 through solder. The solder connects the individual terminals and common terminals of the piezoelectric element 2 and a plurality of terminal lands provided on the flexible wiring board 1. The flexible wiring board 1 has a substantially rectangular outside shape whose short side is slightly shorter than the length of the long side of the piezoelectric element 2. As shown in FIG. 1, the piezoelectric element 2 is connected to one short side of the flexible wiring board 1. On the edge of the other short side of the flexible wiring board 1, a plurality of connection terminals 1a, 1a . . . for connecting a flat cable 5 for relaying the wires are arranged along the short side.

Moreover, on the opposite surface of the flexible wiring board 1 to the surface to which the piezoelectric element 2 is connected, a driving IC 4 (circuit component) for producing a drive voltage for driving the piezoelectric element 2 is soldered at the middle position between the piezoelectric element 2 and the connection terminals 1a, 1a . . . . The driving IC 4 has a substantially rectangular parallelepiped shape, and is mounted on the flexible wiring board 1 so that the longitudinal direction of the driving IC 4 crosses the longitudinal direction of the flexible wiring board 1 at a substantially right angle. The driving IC 4 includes a plurality of driving circuits corresponding to the number of ink ejection outlets provided in the channel unit 3. Each driving circuit supplies a drive voltage of around 15 V to 30 V to each individual terminal of the piezoelectric element 2 through the wire formed on the flexible wiring board 1. The piezoelectric element 2 supplied with the drive voltage is displaced, and generates pressure for ejecting the ink in the corresponding ink pressure chamber.

Moreover, on the flexible wiring board 1, solders 12, 12 (reinforcement members) are deposited on both sides in the longitudinal direction of the driving IC 4. In the plan view, the solders 12, 12 have a substantially oval shape elongated in the longitudinal direction of the flexible wiring board 1, and, as shown in FIG. 2, the height of the solders 12, 12 is shorter than the height of the driving IC 4.

The flat cable 5 is in the form of a substantially rectangular film, and has one end connected to the connection terminals 1a, 1a . . . of the flexible wiring board 1, and the other end connected to a connector 10a of a circuit board 10 having a control circuit for an inkjet printer. The flat cable 5 includes a plurality of wires tied at both ends, and relays a plurality of control signals for driving the driving IC 4, electric power for the operation of a logic circuit and a drive voltage, etc from the circuit board 10. In other words, these signals and electric power are transmitted through the flat cable 5 to the driving IC 4 mounted on the flexible wiring board 1.

Further, a reinforcement frame 6 in the form of a substantially rectangular plate larger than the channel unit 3 and having a substantially rectangular opening 6a larger than the piezoelectric element 2 is bonded to the upper surface of the channel unit 3 by an adhesive in addition to the piezoelectric element 2. The reinforcement frame 6 reinforces the channel unit 3 by surrounding the periphery of the piezoelectric element 2. Moreover, in the reinforcement frame 6, four through-holes 6b, 6b . . . are formed at positions corresponding to the ink supply openings 3a, 3a . . . of the channel unit 3. Further, a plurality of screw holes 6c, 6c . . . are arranged along both long sides of the reinforcement frame 6. Note that the piezoelectric element 2 and the flexible wiring board 1 are exposed from the upper side of the reinforcement frame 6 through the opening 6a of the reinforcement frame 6.

The above-explained channel unit 3, piezoelectric element 2, flexible wiring board 1 and reinforcement frame 6 are connected together with an adhesive, solder, etc. and constitute an integrated laminate body. This laminate body is screwed to the lower surface of a resin holder 7 by using the screw holes 6c, 6c . . . of the reinforcement frame 6. Further, the holder 7 is in a substantially rectangular parallelepiped shape with open top, and stores an ink buffer tank 9 therein. A slit 7a is formed in the lower surface of the holder 7. As shown in FIG. 2, the flexible wiring board 1 and the flat cable 5 are pulled out from the bottom (lower side) of the holder 7 through the slit 7a. In other words, the flexible wiring board 1 and the flat cable 5 are pulled out from the slit 7a by being bent upward substantially perpendicularly once between the piezoelectric element 2 and the driving IC 4, and further bent upward substantially perpendicularly again and pulled up after the mount position of the driving IC 4. As shown in FIG. 2, in this embodiment, the piezoelectric element 2 and the driving IC 4 are placed parallel to each other under and above the bottom surface of the holder 7, respectively. Therefore, the flexible wiring board 1 is bent upward substantially perpendicularly between the piezoelectric element 2 and the slit 7a (the first bent position), bent substantially perpendicularly to be substantially parallel to the bottom surface of the holder 7 between the slit 7a and the driving IC 4 (the second bent position), and bent upward substantially perpendicularly before the side wall of the holder 7 after the driving IC 4 (the third bent position). The solders 12, 12 provided along both sides in the longitudinal direction of the driving IC 4 are extended in the longitudinal direction of the flexible wiring board 1 from the vicinity of the second bent position to the vicinity of the third bent position. The length of the solders 12, 12 is longer than the length of the driving IC 4 in the longitudinal direction of the flexible wiring board 1.

Moreover, a heat sink 8 for releasing heat from the driving IC 4 is provided over the one side wall of the holder 7. The heat sink 8 is a rectangular metal plate curved into a substantially inverted U shape with one end bent outward substantially perpendicularly. This bent portion is positioned inside the holder 7 and in contact with the driving IC 4. The width of the heat sink 8 in the direction along the side wall of the holder 7 is longer than the length of the short side of the flexible wiring board 1 and the flat cable 5. A notch 8a with a width almost equal to the length of the short side of the flexible wiring board 1 and the flat cable 5 is formed in the top (curved portion) of the heat sink 8.

On the bottom surface of the holder 7, a substantially rectangular parallelepiped rubber cushion member 11 (shown only in FIG. 2) with a length similar to the length of the short side of flexible wiring board 1 is provided to face the lower surface of the bent portion of the heat sink 8. The bent portion of the heat sink 8 and the cushion member 11 hold the flexible wiring board 1 and the driving IC 4 therebetween. Thus, the heat generated with the operation of the driving IC 4 is dissipated to the outside of the holder 7 through the heat sink 8.

Further, after the flexible wiring board 1 is bent upward substantially perpendicularly between the driving IC 4 and the connection terminals 1a, 1a . . . (at the third bent position), the flat cable 5 connected to the connection terminals 1a, 1a . . . runs upward through a gap between the side wall of the holder 7 and the heat sink 8 and reaches the upper side of the holder 7 through the notch 8a of the heat sink 8.

The respective color inks are supplied to the ink buffer tank 9 stored in the holder 7 through ink supply tubes (not shown) from four ink cartridges storing cyan, magenta, yellow, and black inks, respectively. The ink buffer tank 9 temporarily stores the supplied inks, and supplies the stored inks to the channel unit 3. In the bottom surface of the holder 7, one substantially rectangular through-hole 7b with a size capable of enclosing the four through-hoes 6b, 6b . . . is formed at a position corresponding to the ink supply openings 3a, 3a . . . of the channel unit 3 and the through-holes 6b, 6b . . . of the reinforcement frame 6. The ink buffer tank 9 placed in a space above the bottom surface of the holder 7 and the reinforcement frame 6 placed in a space below are joined together through the through-hole 7b. It is thus possible to supply the inks in the ink buffer tank 9 into the channel unit 3 through the through-holes 6b, 6b . . . of the reinforcement frame 6 and the ink supply openings 3a, 3a . . . of the channel unit 3.

Above the holder 7 storing the ink buffer tank 9, the circuit board 10 is placed to cover the upper surface of the ink buffer tank 9. In this embodiment, the circuit board 10 functions as a lid of the holder 7. The flat cable 5 pulled to the top of the holder 7 through the notch 8a of the heat sink 8 is connected to the connector 10a attached to the upper surface of the circuit board 10. Thus, the circuit board 10 and the flexible wiring board 1 are electrically connected.

Figure 3:
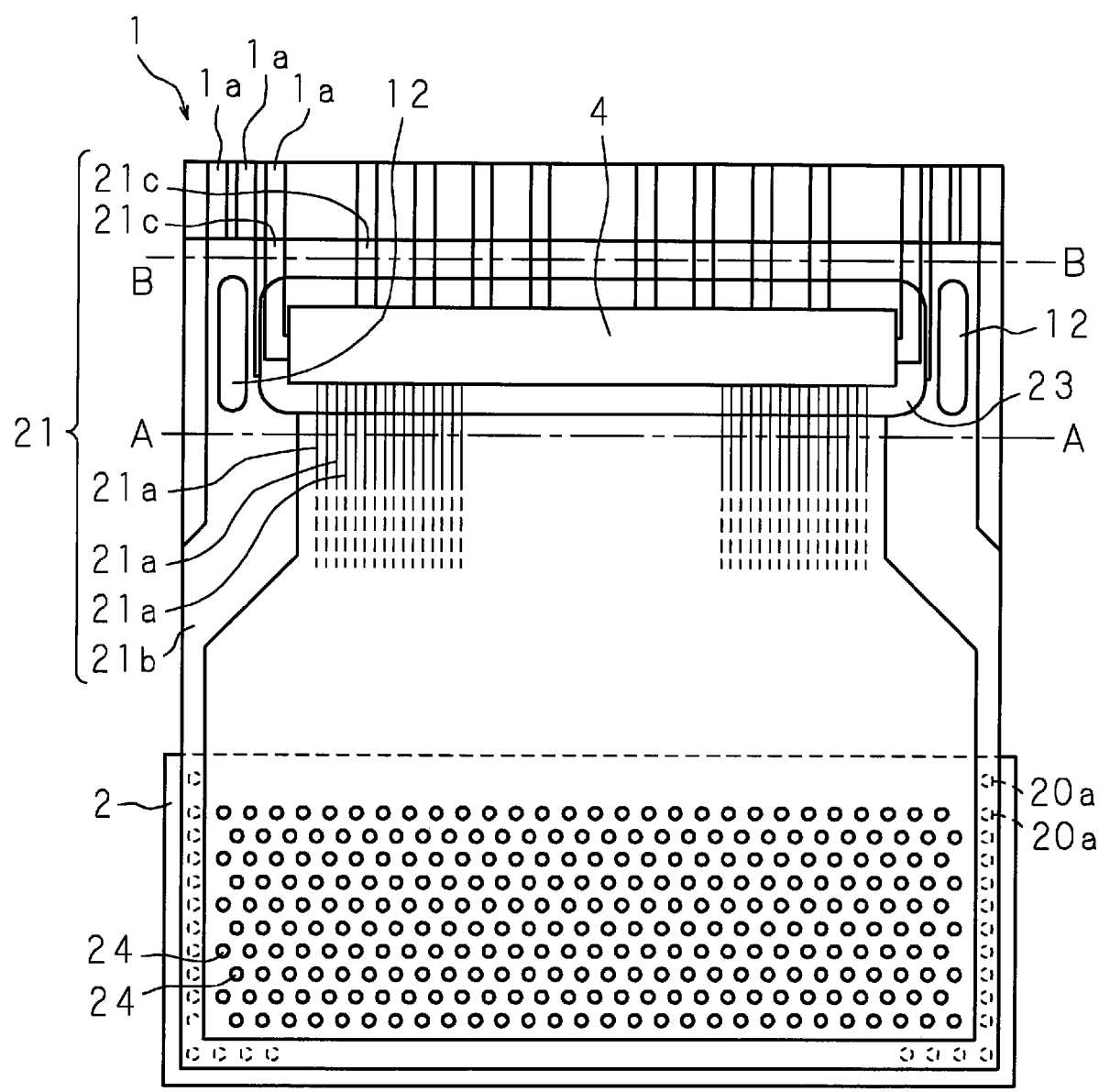
FIG. 3 is a plan view showing the structure of a flexible wiring board.
Figure 4:
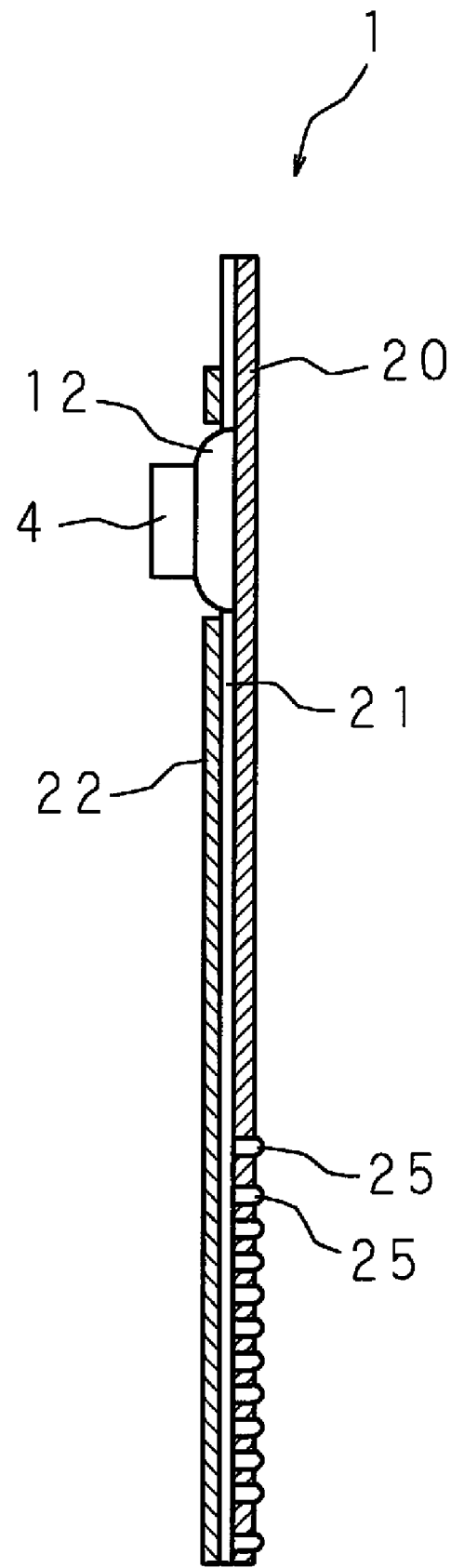
FIG. 4 is a schematic sectional side view showing the structure of the flexible wiring board.

FIG. 3 is a plan views showing the structure of the flexible wiring board 1, and illustrates the surface to which the driving IC 4 is connected. FIG. 4 is a schematic sectional side view showing the structure of the flexible wiring board 1.

The flexible wiring board 1 is a flexible board made of a synthetic resin such as a polyimide resin or a polyester resin, and mainly comprises a substantially rectangular insulating film 20 and a plurality of wires 21 provided on one surface of the insulating film 20. The wires 21 include wires 21a, 21a . . . for a drive voltage (hereinafter referred to as the drive wires) for transmitting a drive voltage from the driving IC 4, a wire for ground potential (hereinafter referred to the ground wire) 21b for supplying ground potential through any one of the connection terminals 1a, 1a . . . connected to the flat cable 5, and signal wires 21c, 21c . . . for transmitting signals from the connection terminals 1a, 1a . . . to the driving IC 4, and are produced by using a metal such as copper or aluminum. Moreover, an insulating membrane 22 of a synthetic resin is formed to cover a plurality of wires 21. The driving IC 4 is soldered to the drive wires 21a, 21a . . . and the signal wires 21c, 21c . . . exposed in an IC connection section 23 that is a portion of the one surface of the insulating film 20 which is not covered with the insulating membrane 22.

The ground wire 21b is a wide wire with a wire width of about several mm to ten and several mm or so, and has such a width that does not cause shortage of power supply even when a drive voltage is applied simultaneously to a plurality of individual terminals. The ground wire 21b surrounds the periphery of the insulating film 20, except for a short side where the connection terminals 1a, 1a . . . are arranged. In other words, both ends of the ground wire 21b are connected to the connection terminals 1a, 1a . . . located at both ends among a plurality of connection terminals 1a, 1a . . . . A plurality of signal wires 21c, 21c . . . extend from the respective connection terminals 1a, 1a . . . to the IC connection section 23 along a longitudinal direction of the insulating film 20, and are connected to the corresponding connection terminals (not shown) of the driving IC 4 by solder.

The drive wires 21a, 21a are thin wires with a wire width of about 20 μm or so, and extend from the IC connection section 23 to the side opposite to the connection terminals 1a, 1a . . . along the longitudinal direction of the insulating film 20. In the area where the drive wires 21a, 21a . . . are provided, as shown in FIG. 3, several hundreds drive wires 21a, 21a . . . are provided at intervals of about 20 μm or so. The drive wires 21a, 21a . . . are connected to the corresponding connection terminals of the driving IC 4 at one end, and connected to a plurality of terminal lands 24, 24 . . . for depositing solder at the other end.

Each of the terminal lands 24, 24 has a substantially circular shape with a diameter of about 150 μm. As shown in FIG. 3, a plurality of terminal lands 24, 24 . . . are arranged in lines along the direction of the short side of the insulating film 20. Further, the lines of terminal lands 24, 24 . . . are arranged parallel to each other so that the terminal lands 24, 24 . . . form a zigzag pattern in the direction of the long side of the insulating film 20.

Through-holes 20a, 20a . . . (see FIGS. 5 and 6) are formed coaxially in the insulating film 20 at positions corresponding to the respective terminal lands 24. The through-holes 20a, 20a . . . have a substantially circular shape smaller than the terminal lands 24, 24 . . . . A part of the terminal lands 24, 24 . . . is exposed from the through holes 20a, 20a . . . to the opposite surface of the insulating film 20. Solder bumps 25, 25 . . . are formed by depositing a solder on the exposed portions of the terminal lands 24, 24 . . . . Additionally, through-holes 20a, 20a of the same size are formed similarly in a portion where the ground wire 21b is provided, and solder bumps 25, 25 . . . for ground potential are formed.

In the insulating membrane 22 covering the ground wire 21b, substantially oval openings elongated in the longitudinal direction of the flexible wiring board 1 are formed on both sides of the mount position of the driving IC 4 along both ends of the driving IC 4. The ground wire 21b is exposed from the openings. The length of the opening is longer than that of the driving IC 4 in the longitudinal direction of the flexible wiring board 1, and the solders 12, 12 are deposited on the exposed portions of the ground wire 21b from the openings. The height of the solders 12, 12 from the insulating film 20 is lower than the height of the driving IC 4. Thus, the solders 12, 12 do not prevent the adhesion between the surface of the driving IC 4 and the heat sink 8. As a reinforcement member for preventing stress caused by bending the flexible wiring board 1 from affecting the connection section between the driving IC 4 and the flexible wiring board 1, the solders 12, 12 are preferably made as high as possible. For example, when the height of the driving IC 4 is 3 to 5 mm or so, the height of the solders 12, 12 is set to 1 to 2 mm or so.

The flexible wiring board 1 is reinforced by the solders 12, 12, and the portion between two solders 12, 12 placed to face each other does not bend in a direction orthogonal to the longitudinal direction of the flexible wiring board 1. When mounting the flexible wiring board 1 in an inkjet head, it is bent along the A-A line and the B-B line shown in FIG. 3 toward a direction substantially orthogonal to the longitudinal direction of the flexible wiring board 1 and mounted. In this case, since both ends of the solders 12, 12 in the longitudinal direction of the flexible wiring board 1 are closer to the bent positions along the A-A line and the B-B line than the connection sections between the connection terminals of the driving IC 4 and the drive wires 21a, 21a . . . and the signal wires 21c, 21c . . . , stress caused by bending is not applied to the connection sections. Here, the A-A line and the B-B line correspond to the above-mentioned second bent position and third bent position, respectively.

As explained above and as shown in FIG. 3, formed on the upper surface of the flexible wiring board 1 are the connection terminals 1a, 1a . . . to which the flat cable is connected, the signal wires 21c, 21c . . . extended from the connection terminals 1a, 1a . . . and terminated at the IC connection section 23, the drive wires 21a, 21a extended from the IC connection section 23 and terminated at the terminal lands 24, 24 . . . the ground wire 21b connected to the connection terminals 1a, 1a . . . at both ends and surrounding the drive wires 21a, 21a . . . and the signal wires 21c, 21c . . . , and the terminal lands 24, 24 . . . . The ground wire 21b is provided along the edge of the insulating film 20. The upper surface of the flexible wiring board 1, except for the connection terminals 1a, 1a . . . and the IC connection section 23, is covered with the insulating membrane 22. In the IC connection section 23 exposed from the insulating membrane 22, the driving IC 4 is mounted by using solder to connect the signal wires 21c, 21c . . . and the drive wires 21a, 21a . . .

Moreover, in this embodiment, on a side of the flexible wiring board 1 on which the driving IC 4 is mounted, the solders 12, 12 connected electrically to the ground wire 21b are formed on both sides of the longitudinal direction of the driving IC 4.

Further, as shown in FIG. 4, the solder bumps 25, 25 . . . deposited on the terminals lands 24, 24 . . . and the ground wire 21b are formed so that they pass through the insulating film 20 and stick out by substantially the same height. Arranged on the lower surface of the flexible wiring board 1 are a large number of solder bumps 25, 25 . . . located at positions corresponding to the terminal lands 24, 24 . . . , and the solder bumps 25, 25 . . . deposited on the ground wire 21b to surround them from three sides.

As shown in FIG. 3, the area where the solder bumps 25, 25 . . . are placed faces the piezoelectric element 2 to be stacked. Further, an end area of the flexible wiring board 1 including the area where the solder bumps 25, 25 . . . are placed also faces the piezoelectric element 2, except for the pull-out side of the flexible wiring board 1. In other words, in the plan view of the flexible wiring board 1, the piezoelectric element 2 located below is exposed from three sides of the flexible wiring board 1 other than the pull-out side. Therefore, after joining the flexible wiring board 1 and the piezoelectric element 2 together, a force acting to separate the connection sections connected by the solder bumps 25, 25 . . . is hardly applied directly to the respective connection sections.

Figure 5:
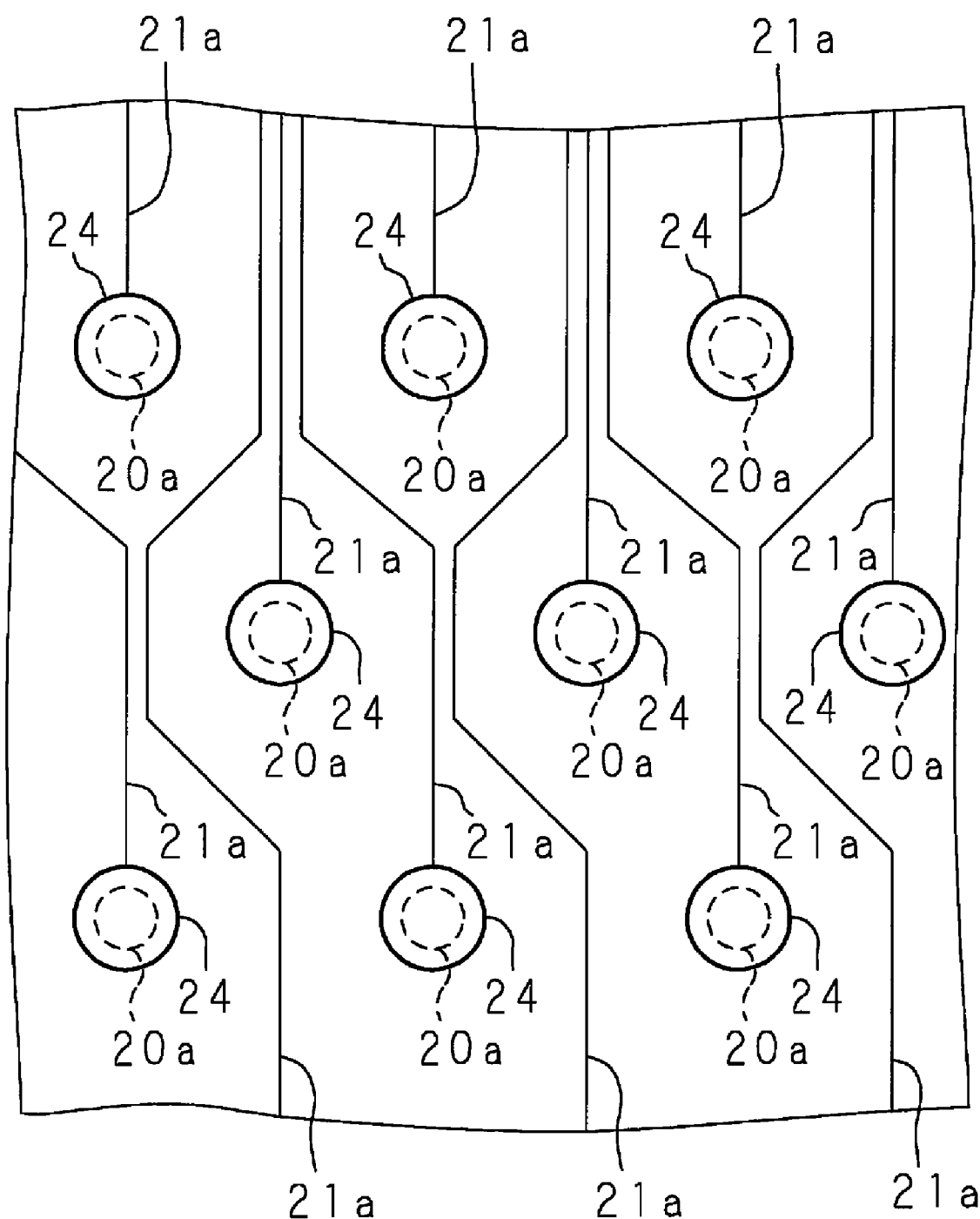
FIG. 5 is an enlarged plan view of the flexible wiring board.

FIG. 5 is an enlarged plan view of the flexible wiring board 1, and illustrates an enlarged view of nine terminal lands 24, 24 . . . provided on the flexible wiring board 1. The terminal lands 24, 24 . . . arranged in a zigzag pattern are connected to the respective ends of the drive wires 21a, 21a . . . , and the drive wires 21a, 21a . . . passing through the space between the terminal lands 24, 24 . . . located closer to the driving IC 4 are connected to the terminal lands 24, 24 . . . located distant from the driving IC 4.

FIG. 6 is an enlarged cross sectional view showing the structure of the connection section between the flexible wiring board 1 and the piezoelectric element 2, and illustrates an enlarged view of one of a plurality of terminal lands 24, 24 . . . of the flexible wiring board 1.

The through-hole 20a is formed in the insulating film 20 at a position corresponding to the terminal land 24 of the flexible wiring board 1. The solder bump 25 (see FIG. 4) is formed by depositing a solder 25a on a part of the terminal land 24 exposed from the through-hole 20a. The solder bump 25 of the flexible wiring board 1 and the individual terminal 2a of the piezoelectric element 2 are arranged to face each other, and the flexible wiring board 1 is heated to melt the solder bump 25 and connect the terminal land 24 and the individual terminal 2a through the solder 25a. At this time, since the insulating film 20 that repels the melted solder 25a is present between adjacent solder bumps 25, the solders 25a that were melted and have fluidity do not join together.

In the flexible wiring board 1 with the above-described structure, since the solders 12, 12 are provided on both sides of the driving IC 4, it is possible to prevent the bent stress caused by bending the flexible wiring board 1 in a direction orthogonal to the longitudinal direction of the flexible wiring board 1 from being applied to the connection sections between the connection terminals of the driving IC 4 and the drive wires 21a, 21a . . . and the signal wires 21c, 21c . . . . Moreover, with the use of the solders 12, 12, it is also possible to realize the function of preventing bending at a low cost. Further, since the height of the solders 12, 12 is lower than the height of the driving IC 4, the solders 12, 12 do not cause interference when bringing the heat sink 8 into contact with the upper surface of the driving IC 4.

Note that although this embodiment illustrates a structure where the solders 12, 12 are provided on the same surface as a surface of the insulating film 20 to which the driving IC 4 is connected, it is not limited to this, and the solders 12, 12 may be provided on the opposite surface, or on both surfaces. When the solders 12, 12 are provided on the opposite surface, through-holes are formed in the insulating film 20, and the solders 12, 12 are deposited on the wire 21 exposed from the through-holes. Moreover, although a structure where the solders 12, 12 are deposited on the ground wire 21b is illustrated, it is not limited to this, and the solders 12, 12 may be deposited other wires such as the drive wires 21a, 21a . . . , or the signal wires 21c, 21c . . . , or it may be possible to provide a dummy wire for depositing the solders 12, 12 and deposit the solders 12, 12 on the dummy wire. Further, although a structure where the flexible wiring board 1 is reinforced by the solders 12, 12 is illustrated, it is not limited to this, and, for example, it may be possible to use an electrically conductive brazing filler metal such as silver solder, brass solder, aluminum solder, phosphor copper solder, or gold solder, or it may be possible to use an electrically conductive adhesive prepared by mixing a binder such as an epoxy resin, urethane, acryl, or polyimide for fixation and an electrically conductive filler such as gold, silver, copper, nickel, aluminum, carbon, or graphite for electrical conductance.

Embodiment 2

Figure 7:
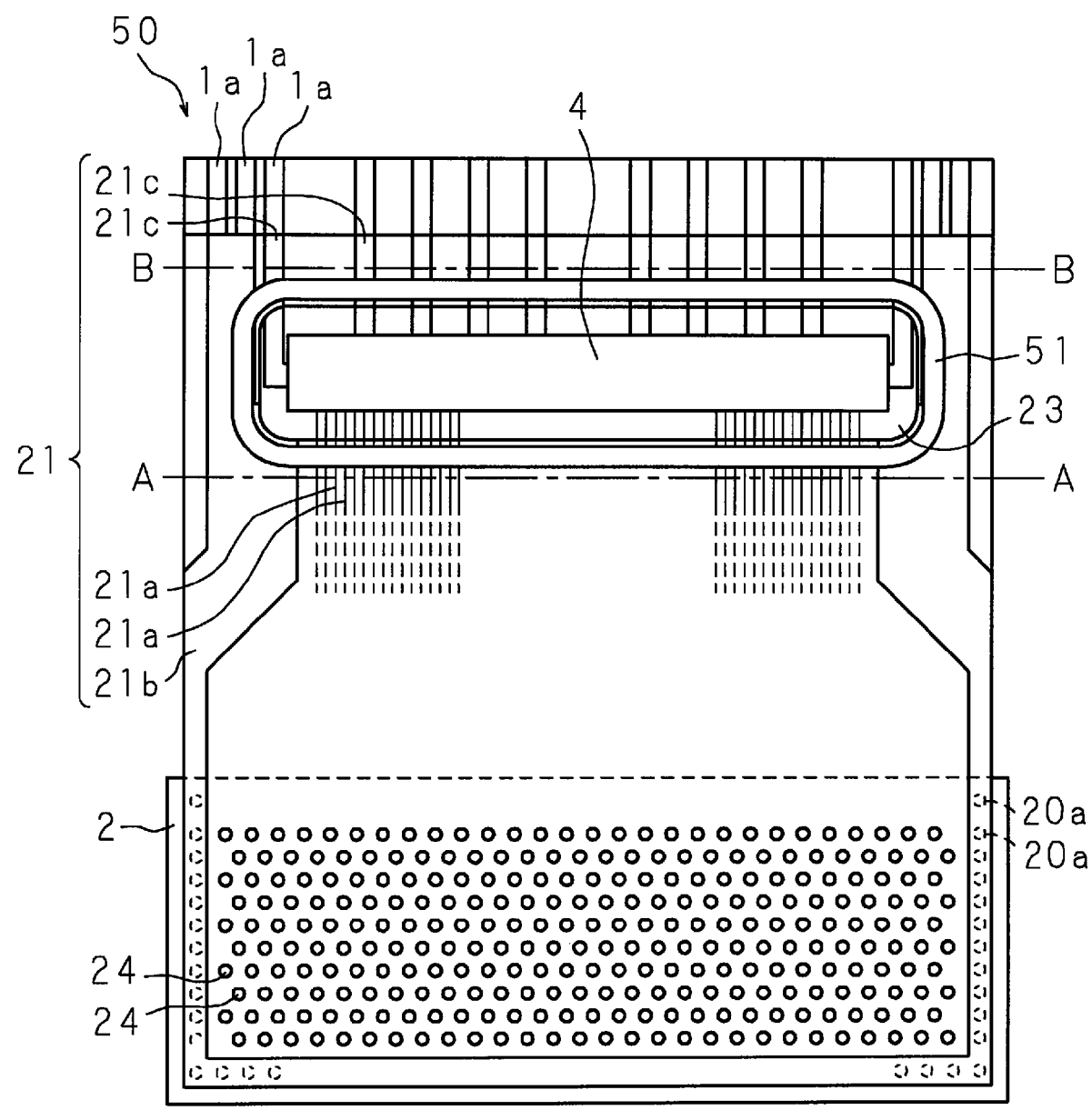
FIG. 7 is a plan view showing the structure of a flexible wiring board according to Embodiment 2.

FIG. 7 is a plan view showing the structure of a flexible wiring board according to Embodiment 2, and illustrates the surface to which a driving IC 4 is connected. On a flexible wiring board 50 according to Embodiment 2, a curing type adhesive 51 made from an epoxy resin is deposited in a ring form to surround the periphery of the driving IC 4 between the A-A line and the B-B line along which the flexible wiring board 50 is bent when mounted in an inkjet head. The cured curing type adhesive 51 acts as a reinforcement frame (reinforcement member) for reinforcing the periphery of the driving IC 4. In other words, after the curing type adhesive 51 is cured, the portion surrounded by the curing type adhesive 51 cannot be bent, and therefore the bending stress is not applied to the connection sections between the connection terminals of the driving IC 4 and the drive wires 21a, 21a . . . and signal wires 21c, 21c . . . .

It is possible to deposit the curing type adhesive 51 made from an epoxy resin on any position of the insulating membrane 22 (see FIG. 4) of the flexible wiring board 50, without exposing a part of the wire 21 as in the case of depositing a solder. Moreover, since the curing type adhesive 51 does not have an electrically conductive characteristic, even when it comes into contact with a plurality of drive wires 21a, 21a . . . or the wires 21c, 21c . . . exposed from the IC connection section 23, there is no possibility of a short circuit of the wires. It is therefore possible to easily deposit the curing type adhesive 51.

Although Embodiment 2 illustrates the structure where the curing type adhesive 51 is deposited in a ring form to entirely surround the periphery of the driving IC 4, it is not limited to this, and it may be possible to surround a part of the periphery of the driving IC 4. Moreover, although an adhesive made from an epoxy resin is used as the curing type adhesive 51, it is not limited to this, and it may be possible to use an adhesive made from, for example, a polyester resin, a polyurethane resin, or an acryl resin.

Since other structures of the flexible wiring board according to Embodiment 2 are the same as the structures of the flexible wiring board according to Embodiment 1, the detailed explanation is omitted by assigning the same reference numerals to the corresponding parts.

In the above-explained embodiment, in the insulating film 20 serving as the base member of the respective wires, the through-hole 20a is formed in a portion where the terminal land 24 is provided so that a part of the terminal land 24 is exposed from a surface opposite to the surface where the wires are provided. However, from the point of view of preventing a short circuit between the terminal lands 24 (the solder bumps 25), it is not limited to this, and the insulating membrane 22 covering the insulating film 20 may have a through-hole corresponding to the through-hole 20a of the insulating film 20. In other words, when the surface of the insulating film 20 where the wires are provided is covered with the insulating membrane 22, it may be possible to form through-holes at positions where the terminal lands 24 are provided in addition to the IC connection section 23. Consequently, since there is no need to form the through-hole 20a in the insulating film 20 as another step, it is possible to reduce the cost of the flexible wiring board 1. In this case, the flexible wiring board 1 may be placed in the holder 7 so that the heat sink 8 comes into contact with the driving IC 4 through the flexile wiring board 1. As the insulating membrane 22, it may be possible to use urethane-based, epoxy-based, or polyimide-based heat curing resins or light curing resins. Among them, it is possible to suitably use a light curing resin from the point of view of the precision of shape.

In this embodiment, a plurality of the reinforcement members are provided on both sides of the circuit component. Thus, with the small amount of reinforcement members provided on both sides of the circuit component, it is possible to prevent bending of the insulting film, or stress caused by bending the insulating film when mounting the wiring board, from affecting the connection section between the circuit component and the insulating film. Further, when the reinforcement members are provided on both sides in a direction crossing the bending direction of the insulating film during mount, it is possible to effectively prevent bending with a small amount of the reinforcement members, thereby reducing an increase in the costs, such as the design cost and the manufacturing cost of the wiring board, due to the reinforcement members.

In this embodiment, a plurality of the reinforcement members are extended along both sides of the circuit component so that an end of each of the reinforcement members is closer to the bent position of the insulating film than an end of the circuit component. Thus, each of the reinforcement members located closer to the bent portion of the insulating film than the circuit component prevents stress caused by bending the insulating film, at a position distant from the connection section between the insulting film and the circuit component. It is therefore possible to prevent destruction of the connection section and improve the yield.

In this embodiment, the reinforcement member is provided to surround the periphery of the circuit component. The reinforcement member surrounding the circuit component from the periphery prevents stress caused by bending the insulating film from affecting the circuit component from the periphery. It is therefore possible to certainly prevent destruction of the connection section between the insulating film and the circuit component, and it is possible to further decrease the defect ratio in the manufacturing step.

In this embodiment, an electrically conductive brazing filler metal or an electrically conductive adhesive is used as the reinforcement member, and the electrically conductive brazing filler metal or the electrically conductive adhesive is deposited on the wires provided on the insulating film. The reinforcement member made from an electrically conductive brazing filler metal or an electrically conductive adhesive makes it possible to use of the same manufacturing step as the manufacturing step of depositing the electrically conductive brazing filler metal or the electrically conductive adhesive for connecting the circuit component to the insulating film. It is therefore possible to prevent destruction of the connection section between the insulating film and the circuit component, without complicating the manufacturing step.

In this embodiment, a curing type adhesive is used as the reinforcement member. Unlike an electrically conductive brazing filler metal, the reinforcement member made of a curing type adhesive does not need to be placed on the wires, and can be deposited irrespective of the pattern of wires provided on the insulating film. For example, by providing the reinforcement member to surround the periphery of the circuit component without a gap, it is possible to more certainly prevent bending of the insulating film and destruction of the connection section between the insulting film and the circuit component.

In this embodiment, when the reinforcement member and the circuit component are provided on the same surface of the insulating film, the height of the reinforcement member is arranged to be lower than the height of the circuit component. Thus, the reinforcement member does not interfere with the mount of the circuit component and the wiring board having the circuit component. For example, when heat is released by bringing a heat sink into contact with the upper surface of the circuit component, there is no possibility that the reinforcement member may come into contact with the heat sink and impair the adhesion between the circuit component and the heat sink, and therefore it is possible to efficiently release heat generated by the operation of the circuit component.

As this description may be embodied in several forms without departing from the spirit of essential characteristics thereof, the present embodiments are therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

The invention claimed is:

1. A wiring board comprising:
an insulating film having a plurality of wires;
a circuit component comprising a plurality of sides connected to the wires on one surface of the insulating film; and
a plurality of reinforcement members, attached to the insulating film, for preventing the insulating film from being bent, wherein each of the plurality of wires has a connection terminal on one end opposing the portion connected to the circuit component, and
the plurality of connection terminals are provided at a region outside of a region of the insulating film in which the reinforcement members are provided, and wherein
the plurality of the reinforcement members are positioned to extend only on at least a first side and a second side of the circuit component, but not to extend along the plurality of wires, wherein the first side of the circuit component is opposite the second side, and the circuit component is held therebetween, and the first side and the second side are other than sides of the circuit component to which the wires are connected.

2. The wiring board according to claim 1, wherein the plurality of reinforcement members comprise an electrically conductive brazing filler metal or an electrically conductive adhesive deposited on either the wires or the insulating film.

3. The wiring board according to claim 1, wherein the plurality of reinforcement members comprise a curing type adhesive.

4. The wiring board according to claim 1, wherein the plurality of reinforcement members are attached to the one surface, and
each of the reinforcement members has a height lower than a height of the circuit component.

5. A wiring board comprising:
an insulating film having a plurality of wires;
a circuit component connected to the wires on one surface of the insulating film; and
a reinforcement member, attached to the insulating film, for preventing the insulating film from being bent, wherein each of the plurality of wires has a connection terminal on one end opposing the portion connected to the circuit component, and the plurality of connection terminals are provided at a region outside of a region of the insulating film in which the reinforcement member is provided, and wherein the reinforcement member is provided such that the reinforcement member surrounds a periphery of the circuit component, but does not surround the plurality of wires.

6. The wiring board according to claim 5, wherein the reinforcement member is an electrically conductive brazing filler metal or an electrically conductive adhesive deposited on either the wires or the insulating film.

7. The wiring board according to claim 5, wherein the reinforcement member is a curing type adhesive.

8. The wiring board according to claim 5, wherein the reinforcement member is attached to the one surface, and
the reinforcement member has a height lower than a height of the circuit component.

9. A wiring board comprising:
an insulating film having a plurality of wires and bent at a predetermined position;
a circuit component connected to the wires on one surface of the insulating film; and
at least one reinforcement member, attached to the insulating film in a direction crossing a bending direction of the insulating film, for preventing the insulating film from being bent other than the predetermined position, wherein each of the plurality of wires has a connection terminal on one end opposing the portion connected to the circuit component, and the plurality of connection terminals are provided at a region outside of a region of the insulating film in which the at least one reinforcement member is provided, and wherein the predetermined position is located within an area which extends between the circuit component and the connection terminals.

10. The wiring board according to claim 9, wherein the at least one reinforcement member comprises a plurality of reinforcement members positioned on at least one of a first or a second side of the circuit component, wherein the first side of the circuit component is opposite the second side, and the circuit component is held therebetween.

11. The wiring board according to claim 9, wherein the at least one reinforcement member comprises a plurality of reinforcement members provided on both sides of the circuit component and extended along the circuit component, and, wherein each of the plurality of reinforcement members has an end positioned closer to the predetermined position of the insulating film than an end of the circuit component.

12. The wiring board according to claim 9, wherein the reinforcement member is provided to surround a periphery of the circuit component.

13. The wiring board according to claim 9, wherein the reinforcement member is an electrically conductive brazing filler metal or an electrically conductive adhesive deposited on either the wires or the insulating film.

14. The wiring board according to claim 9, wherein the reinforcement member is a curing type adhesive.

15. The wiring board according to claim 9, wherein the reinforcement member is attached to the one surface, and the reinforcement member has a height lower than a height of the circuit component.

* * * * *